United States Patent
Yang et al.

(10) Patent No.: US 8,476,775 B2
(45) Date of Patent: Jul. 2, 2013

(54) INTEGRATED CIRCUIT PACKAGING SYSTEM WITH EMBEDDED INTERCONNECT AND METHOD OF MANUFACTURE THEREOF

(75) Inventors: JoungIn Yang, Koyang-si (KR); YoungSik Cho, Hwasung-si (KR); SungHyun Lee, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 12 days.

(21) Appl. No.: 12/639,997

(22) Filed: Dec. 17, 2009

(65) Prior Publication Data

US 2011/0147906 A1    Jun. 23, 2011

(51) Int. Cl.
*H01L 23/28* (2006.01)
*H01L 21/00* (2006.01)

(52) U.S. Cl.
USPC ............ 257/787; 257/686; 438/127; 438/109

(58) Field of Classification Search
USPC ................. 257/666, 777, 782, 783, 778, 698, 257/686, 787; 438/107, 108, 109, 110, 118, 438/119, 127
See application file for complete search history.

(56) References Cited

U.S. PATENT DOCUMENTS

| | | | |
|---|---|---|---|
| 5,844,315 A | 12/1998 | Melton et al. | |
| 6,180,881 B1 * | 1/2001 | Isaak | 174/524 |
| 6,274,949 B1 | 8/2001 | Lioux et al. | |
| 6,303,997 B1 * | 10/2001 | Lee | 257/778 |
| 6,388,333 B1 * | 5/2002 | Taniguchi et al. | 257/777 |
| 6,564,454 B1 | 5/2003 | Glenn et al. | |
| 6,781,241 B2 * | 8/2004 | Nishimura et al. | 257/777 |
| 6,798,057 B2 | 9/2004 | Bolkin et al. | |
| 6,924,550 B2 | 8/2005 | Corisis et al. | |
| 7,180,165 B2 * | 2/2007 | Ellsberry et al. | 257/686 |
| 7,808,095 B2 * | 10/2010 | Jung | 257/686 |
| 7,847,384 B2 * | 12/2010 | Kobayashi et al. | 257/686 |
| 7,939,924 B2 * | 5/2011 | Yoo | 257/686 |
| 2004/0145044 A1 * | 7/2004 | Sugaya et al. | 257/698 |
| 2007/0216006 A1 | 9/2007 | Park et al. | |
| 2008/0217792 A1 | 9/2008 | Onodera et al. | 257/778 |
| 2010/0308443 A1 * | 12/2010 | Suthiwongsunthorn et al. | 257/621 |

OTHER PUBLICATIONS

U.S. Appl. No. 12/408,662, filed Mar. 20, 2009, Yang et al.

* cited by examiner

*Primary Examiner* — S. V. Clark
(74) *Attorney, Agent, or Firm* — Ishimaru & Associates LLP

(57) ABSTRACT

A method of manufacture of an integrated circuit packaging system includes: providing an integrated circuit with an adhesive attached thereto; connecting the integrated circuit and a plated interconnect pad; attaching an embedded interconnect to the plated interconnect pad; and forming an encapsulation, having an encapsulation first side and an encapsulation second side, around the integrated circuit, the embedded interconnect, and the plated interconnect pad with the embedded interconnect exposed from the encapsulation second side and the plated interconnect pad and the adhesive exposed from the encapsulation second side.

20 Claims, 6 Drawing Sheets

INTEGRATED CIRCUIT PACKAGING SYSTEM WITH EMBEDDED INTERCONNECT AND METHOD OF MANUFACTURE THEREOF

TECHNICAL FIELD

The present invention relates generally to an integrated circuit packaging system, and more particularly to a system for an integrated circuit packaging system with an embedded interconnect.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit packaging system providing low cost manufacturing, improved yield, low profile, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an integrated circuit with an adhesive attached thereto; connecting the integrated circuit and a plated interconnect pad; attaching an embedded interconnect to the plated interconnect pad; and forming an encapsulation, having an encapsulation first side and an encapsulation second side, around the integrated circuit, the embedded interconnect, and the plated interconnect pad with the embedded interconnect exposed from the encapsulation second side and the plated interconnect pad and the adhesive exposed from the encapsulation second side.

The present invention provides an integrated circuit packaging system including: an integrated circuit; an adhesive attached to the integrated circuit; a plated interconnect pad connected to the integrated circuit; an embedded interconnect attached to the plated interconnect pad; and an encapsulation, having an encapsulation first side and an encapsulation second side, around the integrated circuit, the embedded interconnect, and the plated interconnect pad with the embedded interconnect exposed from the encapsulation second side and the plated interconnect pad and the adhesive exposed from the encapsulation second side.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
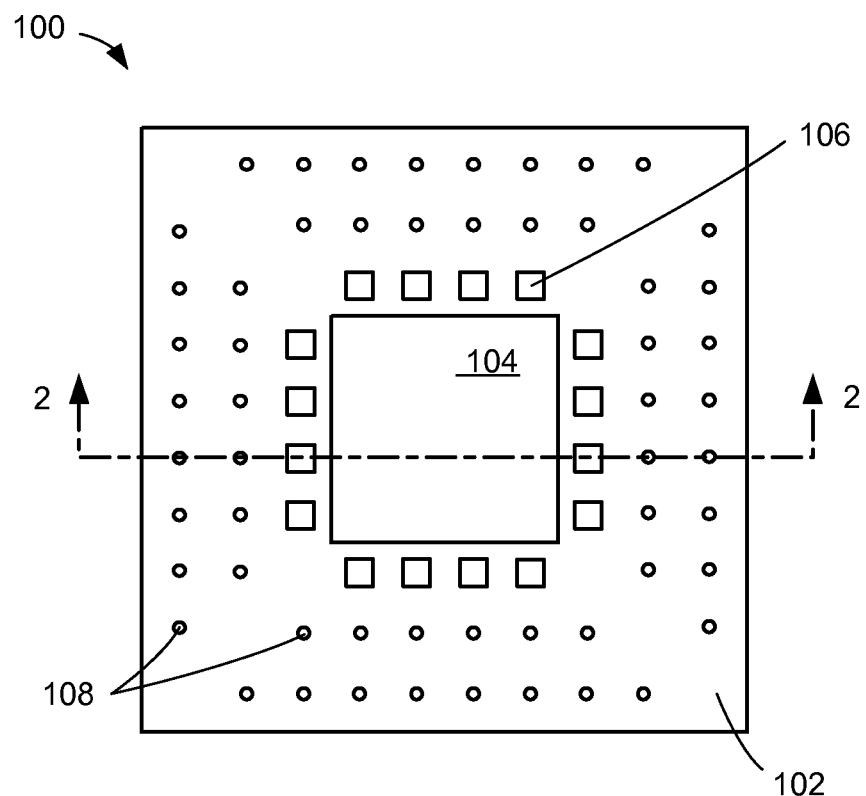
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact between elements. The term "processing" as used herein includes deposition of material, patterning, exposure, development, etching, cleaning, molding, and/or removal of the material or as required in forming a described structure.

Referring now to FIG. 1, therein is shown a top view of an integrated circuit packaging system 100 in a first embodiment of the present invention. The top view depicts an encapsulation 102, such as a cover including an epoxy molding compound. An adhesive 104, such as a thermally conductive adhesive film or paste, can be exposed from the encapsulation 102. The adhesive 104 can be exposed at an interior region of the encapsulation 102.

Plated interconnect pads 106, such as contact pads made from conductive materials including aluminum, nickel/silver, or silver/gold alloys, can be exposed from the encapsulation 102. The plated interconnect pads 106 can be exposed from the encapsulation 102 around the interior region of the encapsulation 102 and adjacent to the adhesive 104.

Through interconnects 108, such as embedded solder balls, can be exposed from and surrounded by the encapsulation 102. The through interconnects 108 can be exposed from the encapsulation 102 along the peripheral portion of the encapsulation 102.

For illustrative purposes, the integrated circuit packaging system 100 is shown with the through interconnects 108 in an array configuration although it is understood that the through interconnects 108 can have a different configuration. For example, the through interconnects 108 can have a staggered configuration.

Figure 2:
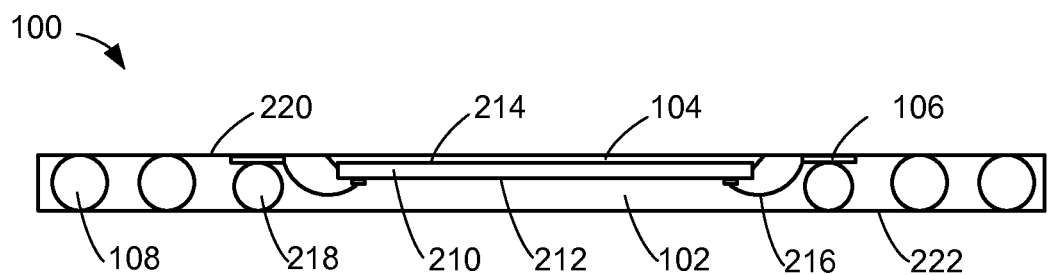
FIG. 2 is cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts an integrated circuit 210, such as an integrated circuit die, a thin or ultrathin integrated circuit die, having an integrated circuit active side 212 and an integrated circuit non-active side 214. The integrated circuit active side 212 can have active circuitry (not shown) fabricated thereon.

The adhesive 104 can be along the integrated circuit non-active side 214. The adhesive can serve other functions such as a thermal dissipation surface, a planar rigidity structure for mitigating warpage, or a protective layer to prevent damage to the integrated circuit 210.

The integrated circuit 210 can be connected to the plated interconnect pads 106 with internal interconnects 216, such as bond wires or ribbon bond wires. The internal interconnects 216 can connect the integrated circuit active side 212 and the plated interconnect pads 106. The plated interconnect pads 106 can be adjacent to the integrated circuit 210. The internal interconnects 216 are in direct contact with no intervening elements with the intergrated circuit 210 and the plated interconnect pads 106.

Embedded interconnects 218, such as embedded solder balls, can be attached to the plated interconnect pads 106. The embedded interconnects 218 have a spherical or elliptical shape. The embedded interconnects 218 can act as a test site for the integrated circuit 210.

The encapsulation 102 can partially cover the adhesive 104 and the plated interconnect pads 106 and can cover the integrated circuit 210, the internal interconnects 216, the embedded interconnects 218, and the through interconnects 108. The encapsulation 102 can have an encapsulation first side 220 and an encapsulation second side 222. The adhesive 104 can be exposed from and coplanar with the encapsulation first side 220. The plated interconnect pads 106 can be exposed from and coplanar with the encapsulation first side 220.

The through interconnects 108 can be exposed from the encapsulation first side 220 and the encapsulation second side 222. The portion of the through interconnects 108 exposed along the encapsulation first side 220 can be coplanar with the encapsulation first side 220. The portion of the through interconnects 108 exposed from the encapsulation second side 222 can be coplanar with the encapsulation second side 222. The through interconnects 108 can have a spherical or elliptical shape. The spherical or elliptical shape of the through interconnects 108 function as a mold locking feature in the encapsulation 102

The embedded interconnects 218 can be exposed from the encapsulation second side 222. The spherical or elliptical shape of the embedded interconnects 218 can function as a mold locking feature in the encapsulation 102. The mold lock with the embedded interconnects 218 improves reliability of the plated interconnect pads 106 by holding the plated interconnect pads 106 in position.

It has been discovered that the present invention provides the integrated circuit packaging system 100 having a lower package profile, increased through connectivity, and improved reliability. The integrated circuit packaging system 100 provides a lower profile and reduces manufacturing costs because it does not require a carrier, such as a laminated substrate or a printed circuit board. The encapsulation and adhesive provide improved reliability with package rigidity and by protecting integrated circuit from damages, such as chipping or scratching or other damage during manufacture and assembly. The embedded interconnects form a mold interlock with the encapsulation. The plated interconnect pad attached to the embedded interconnect can be securely held in place because of the mold interlock, thus improving reliability. The through interconnects can provide increased through connectivity from packages or devices below the integrated circuit package system to those that are above.

Figure 3:
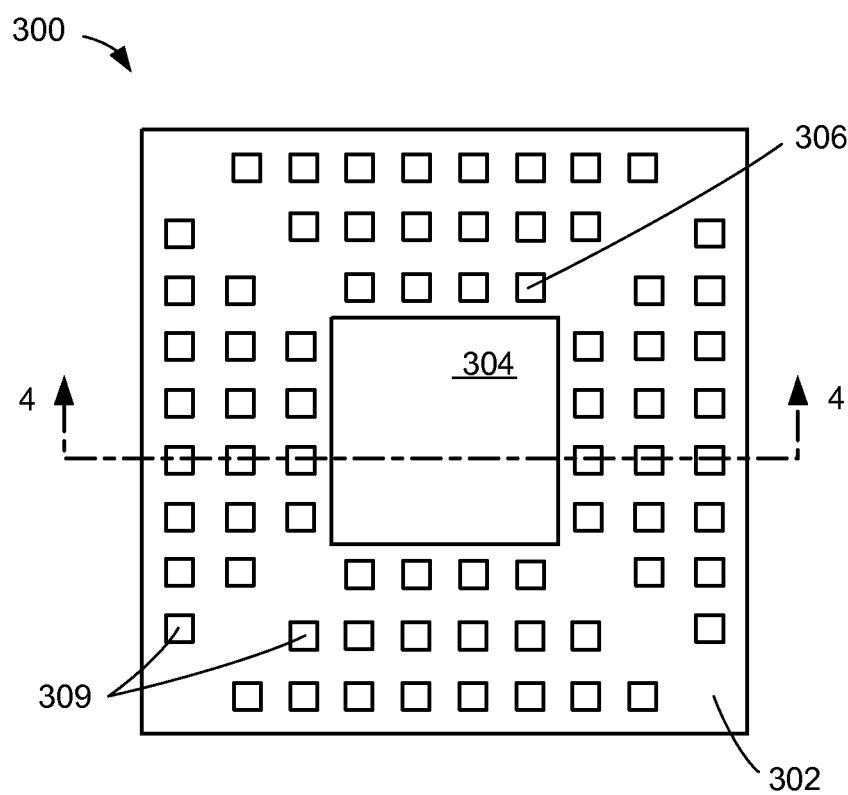
FIG. 3 is a top view of an integrated circuit packaging system in a second embodiment of the present invention.

Referring now to FIG. 3, therein is shown a top view of an integrated circuit packaging system 300 in a second embodiment of the present invention. The top view depicts an encapsulation 302, such as a cover including an epoxy molding compound. An adhesive 304, such as a thermally conductive adhesive film or paste, can be exposed from the encapsulation 302. The adhesive 304 can be exposed at an interior region of the encapsulation 302.

Plated interconnect pads 306, such as contact pads made from conductive materials including aluminum, nickel/silver, or silver/gold alloys, can be exposed from the encapsulation 302. The plated interconnect pads 306 can be exposed from the encapsulation 302 around the interior region of the encapsulation 302 and adjacent to the adhesive 304.

Interlock pads 309, such as contact pads made from conductive materials including aluminum, nickel/silver, or silver/gold alloys, can be exposed from the encapsulation 302. The interlock pads 309 can be exposed from the encapsulation 302 along the peripheral portion of the encapsulation 302.

For illustrative purposes, the integrated circuit packaging system 300 is shown with the interlock pads 309 in an array configuration although it is understood that the interlock pads 309 can have a different configuration. For example, the interlock pads 309 can have a staggered configuration.

Figure 4:
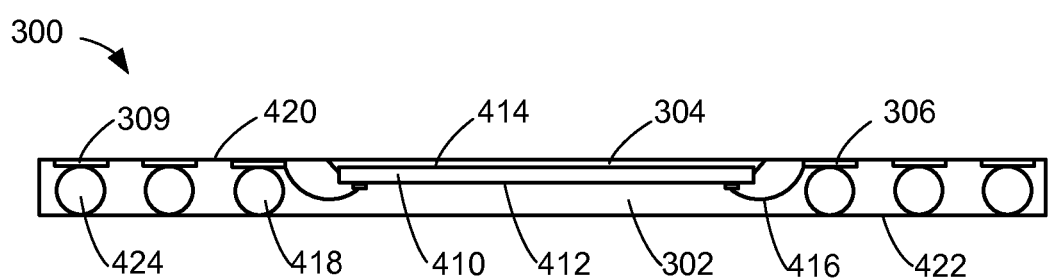
FIG. 4 is a cross-sectional view of the integrated circuit packaging system along line 4-4 of FIG. 3.

Referring now to FIG. 4, therein is shown a cross-sectional view of the integrated circuit packaging system 300 along line 4-4 of FIG. 3. The cross-sectional view depicts an integrated circuit 410, such as an integrated circuit die, a thin or ultrathin integrated circuit die, having an integrated circuit active side 412 and an integrated circuit non-active side 414. The integrated circuit active side 412 can have active circuitry (not shown) fabricated thereon.

The adhesive 304 can be along the integrated circuit non-active side 414. The adhesive can serve other functions such as a thermal dissipation surface, a planar rigidity structure for mitigating warpage, or a protective layer to prevent damage to the integrated circuit 410.

The integrated circuit 410 can be connected to the plated interconnect pads 306 with internal interconnects 416, such as bond wires or ribbon bond wires. The internal interconnects 416 can connect the integrated circuit active side 412 and the plated interconnect pads 306. The plated interconnect pads 306 can be adjacent to the integrated circuit 410.

Embedded interconnects 418, such as embedded solder balls, can be attached to the plated interconnect pads 306. The embedded interconnects 418 can have a spherical shape or elliptical shape. The embedded interconnects 418 can act as a test site for the integrated circuit 410.

The interlock pads 309 can be adjacent to the plated interconnect pads 306. Interlock interconnects 424, such as solder balls, can be attached to the interlock pads 309. The interlock interconnects 424 can be attached to the interlock pads 309 facing away from the side exposed from the encapsulation 302.

The encapsulation 302 can partially cover the adhesive 304, the plated interconnect pads 306, and the interlock pads 309 and can cover the integrated circuit 410, the internal interconnects 416, the embedded interconnects 418, and the interlock interconnects 424. The encapsulation 302 can have an encapsulation first side 420 and an encapsulation second side 422. The adhesive 304 can be exposed from and coplanar with the encapsulation first side 420. The plated interconnect pads 306 can be exposed from and coplanar with the encapsulation first side 420. The interlock pads 309 can be exposed from and coplanar with the encapsulation first side 420.

The interlock interconnects 424 can be exposed from the encapsulation the encapsulation second side 422. The portion of the interlock interconnects 424 exposed along the encapsulation second side 422 can be coplanar with the encapsulation second side 422. The interlock interconnects 424 can have a spherical or elliptical shape. The spherical or elliptical shape of the interlock interconnects 424 function as a mold locking feature in the encapsulation 302. The mold lock improves reliability of the interlock pads 309 by holding the interlock pads 309 in position.

The embedded interconnects 418 can be exposed from the encapsulation second side 422. The exposed portion of the embedded interconnects 418 can be coplanar with the encapsulation second side 422. The spherical or elliptical shape of the embedded interconnects 418 function as a mold lock with the encapsulation 302. The mold lock with the embedded interconnects 418 improves reliability of the plated interconnect pads 306 by holding the plated interconnect pads 306 in position.

Figure 5:
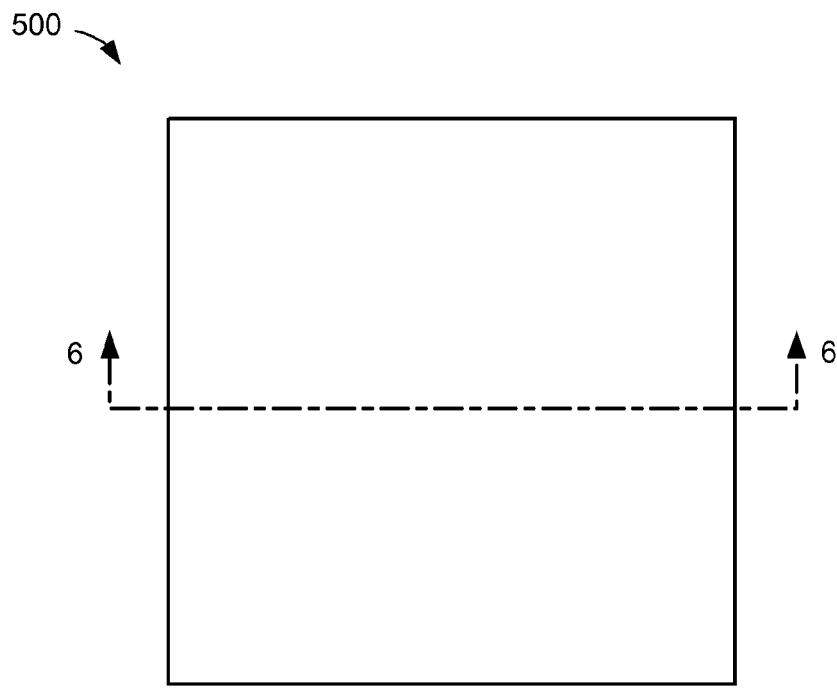
FIG. 5 is a top view of an integrated circuit package-on-package system in a third embodiment of the present invention.

Referring now to FIG. 5, therein is shown a top view of an integrated circuit package-on-package system 500 in a third embodiment of the present invention. The top view depicts a stackable integrated circuit package 530, such as an encapsulated integrated circuit or memory device.

For illustrative purposes, the integrated circuit package-on-package system 500 is shown with the stackable integrated circuit package 530 having a square shape, although it is understood that the stackable integrated circuit package 530 can have a different shape. For example, the stackable integrated circuit package 530 can have a rectangular shape.

Figure 6:
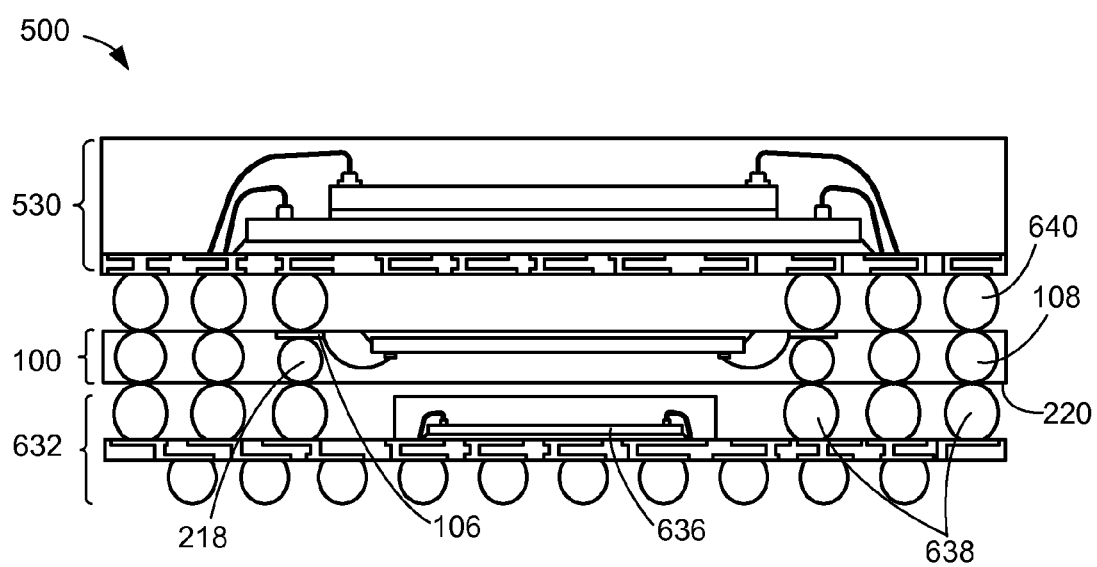
FIG. 6 is a cross-sectional view of the integrated circuit package-on-package system along line 6-6 of FIG. 5.

Referring now to FIG. 6, therein is shown a cross-sectional view of the integrated circuit package-on-package system 500 along line 6-6 of FIG. 5. The cross-sectional view depicts a mountable structure 632. The mountable structure 632 can include a carrier 634, such as a printed circuit board or laminated substrate.

An integrated circuit device 636, such as a packaged integrated circuit, a flip-chip, a radio frequency device, or a logical device, can be mounted over the carrier 634. Mounting interconnects 638, such as solder balls, solder posts, solder bumps, or conductive posts, can be attached to the carrier 634 and adjacent to the integrated circuit device 636.

The integrated circuit packaging system 100 of FIG. 1 can be mounted over the mountable structure 632. The encapsulation second side 222 can be mounted over the mountable structure 632 with the embedded interconnects 218 connected to the mountable structure 632. The embedded interconnects 218 can be connected to the mountable structure 632 with the mounting interconnects 638. The through interconnects 108 exposed from the encapsulation second side 222 can be connected to the mountable structure 632 with the mounting interconnects 638.

The stackable integrated circuit package 530 can be mounted over the encapsulation first side 220. The mountable structure 632 can be connected to the plated interconnect pads 106 with stacking interconnects 640, such as solder balls, solder bumps, or conductive bumps. The stacking interconnects 640 can connect the through interconnects 108 exposed from the encapsulation first side 220 and the mountable structure 632.

The mountable structure 632 and the stackable integrated circuit package 530 may be tested to ensure KGD before the package-on-package assembly process. This ensures any bad device is sorted out such that the yield for the integrated circuit package-on-package system 500 is not impacted by bad device. The integrated circuit package-on-package system 500 may further undergo testing during and after assembly.

It has also been discovered that the present invention provides an integrated circuit package-on-package system with a lower total package height and improved input and output (I/O) control. The integrated circuit package-on-package system including the integrated circuit packaging system reduces overall package height because the integrated circuit packaging system does not have a carrier, such a laminated substrate or printed circuit board. The embedded interconnects and through interconnects of the integrated circuit packaging system provide improved I/O control by allowing manufactures to increase or decrease the connectivity between the top and bottom packages.

Figure 7:
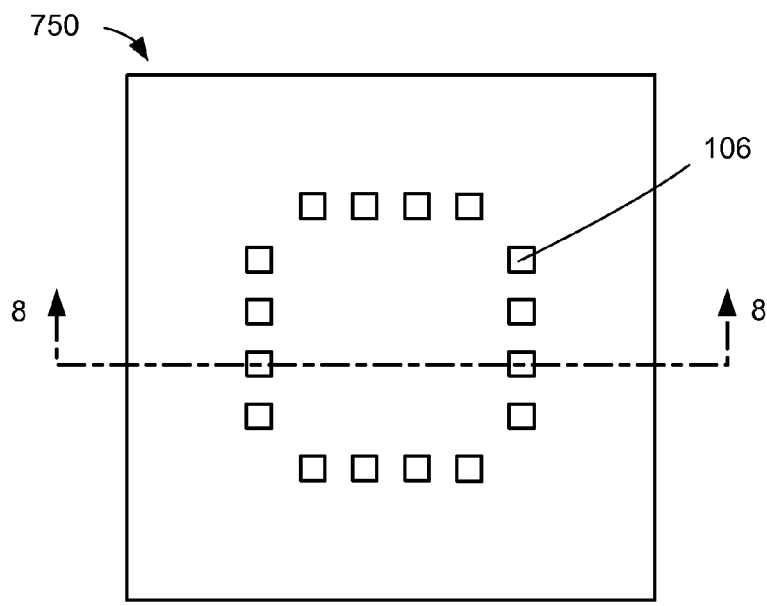
FIG. 7 is a top view of a top view of a portion of a lead frame.

Referring now to FIG. 7, therein is shown a top view of a portion of a lead frame 750. The top view depicts the lead frame 750. The plated interconnect pads 106 can be formed over the lead frame 750. The plated interconnect pads 106 are formed as a separate and distinct structure from the lead frame 750. The plated interconnect pads 106 can be formed by a number of methods. For example, the plated interconnect pads 106 can be formed by known methods such as chemical or physical vapor deposition.

Figure 8:
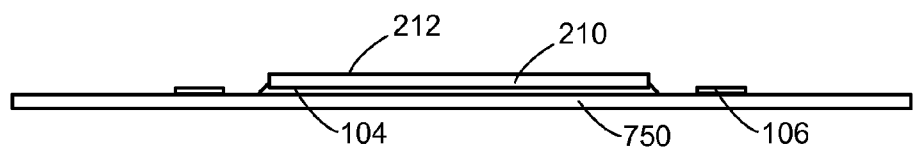
FIG. 8 is a cross-sectional view of the structure of FIG. 7 along line 8-8 of FIG. 7 in mounting the integrated circuit.

Referring now to FIG. 8, therein is shown a cross-sectional view of the structure of FIG. 7 along line 8-8 of FIG. 7 in mounting the integrated circuit 210. The integrated circuit 210 can be mounted over the lead frame 750 with the adhesive 104 in between. The integrated circuit active side 212 is shown facing away from the lead frame 750. The integrated circuit 210 is shown between the plated interconnect pads 106.

Figure 9:
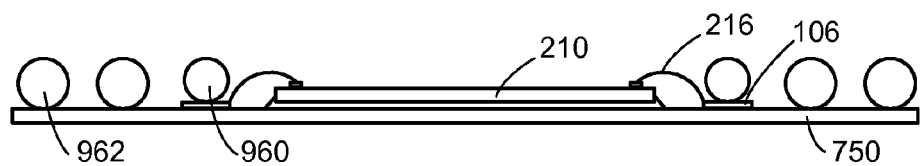
FIG. 9 is the structure of FIG. 8 in attaching first interconnects and second interconnects.

Referring now to FIG. 9, therein is shown the structure of FIG. 8 in attaching a first interconnects 960 and second interconnects 962. The first interconnects 960, such as solder balls, solder bumps, or conductive bumps, can be attached to the plated interconnect pads 106. The first interconnects 960 can have a spherical or elliptical shape.

The second interconnects 962, such as solder balls, solder bumps, or conductive bumps, can be attached to the lead frame 750. The second interconnects 962 can have a spherical or elliptical shape.

The first interconnects 960 and the second interconnects 962 can be formed in a number of different ways. For example, the first interconnects 960 and the second interconnects 962 can be formed by known methods such as a solder ball mounting over a solder ball mask. As a further example, the first interconnects 960 and the second interconnects 962 can be formed by a reflow process after flux pin doting on the lead frame 750. The internal interconnects 216 can attach the integrated circuit 210 and the plated interconnect pads 106.

Figure 10:
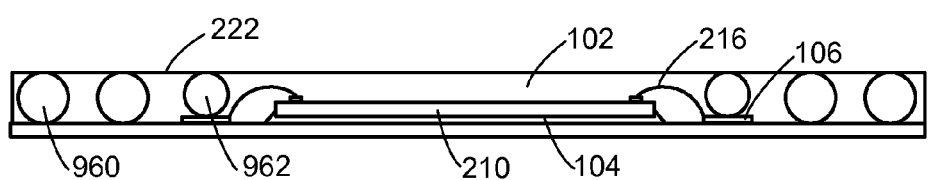
FIG. 10 is the structure of FIG. 9 in forming the encapsulation.

Referring now to FIG. 10, therein is shown the structure of FIG. 9 in forming the encapsulation 102. The encapsulation 102 can partially cover the adhesive 104 and the plated interconnect pads 106. The encapsulation 102 can be formed by a number of different methods. For example, the structure of FIG. 9 can be placed between planar mold chase (not shown) and can undergo transfer or injection molding.

The encapsulation 102 can be formed to have the encapsulation second side 222. The encapsulation 102 can cover the integrated circuit 210, the internal interconnects 216, the first interconnects 960, and the second interconnects 962. The encapsulation 102 can be formed to expose the second interconnects 962 from the encapsulation second side 222. The encapsulation second side 222 can be coplanar with the portion of the second interconnects 962 exposed from and the encapsulation second side 222.

The first interconnects 960 can be exposed from the encapsulation second side 222 to form the embedded interconnects 218 of FIG. 1. The embedded interconnects 218 can be formed to be coplanar with the encapsulation second side 222. The spherical or elliptical shape of the embedded interconnects 218 function as a mold lock with the encapsulation 102.

Figure 11:
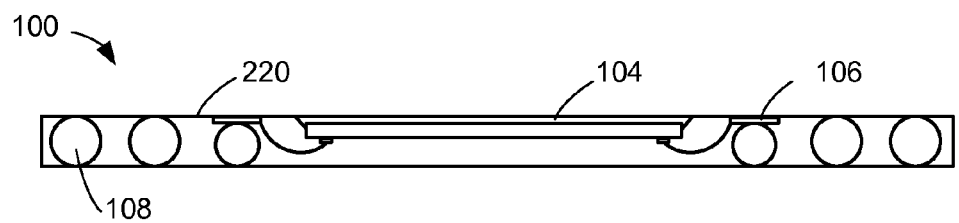
FIG. 11 is the structure of FIG. 10 in forming the integrated circuit packaging system of FIG. 1.

Referring now to FIG. 11, therein is shown the structure of FIG. 10 in forming the integrated circuit packaging system 100 of FIG. 1. The lead frame 750 of FIG. 7 can be removed to form the integrated circuit packaging system 100. The lead frame 750 can be removed by a number of different methods. For example, the lead frame can be removed by know methods such as chemical etching with a selective etch pattern. The lead frame 750 can be removed to form a solid ground plane (not shown) or a reference plane (not shown).

The lead frame 750 can be removed to form the encapsulation first side 220. The adhesive 104 can be exposed from and coplanar with the encapsulation first side 220. The plated interconnect pads 106 can be exposed from and coplanar with the encapsulation first side 220. The plated interconnect pads 106 can include characteristics of the lead frame 750 removed. The characteristics of the lead frame 750 removed can include physical features, such as an etched surface, grinding marks, sanding marks, polishing marks, other removal tool marks, chemical residue, or a chemically processed surface.

The lead frame 750 can be substantially removed to expose the second interconnects 962 of FIG. 9 from the encapsulation first side 220 to form the through interconnects 108. The spherical or elliptical shape of the through interconnects 108 function as a mold lock with the encapsulation 102.

The lead frame 750, the first dam bar 754, the second dam bar 756, the third dam bar 758, the first tie bar 755, the second tie bar 757, and the third dam bar 759 can be selectively separated or have portions selectively removed to isolate the plated interconnect pads 106 and the through interconnects 108. For example, the first tie bar 755 can be removed to isolate the first dam bar 754 from the paddle region 752 and the second dam bar 756. As a further example, the portions of the first dam bar 754 can be removed to maintain connectivity between a number of the plated interconnect pads 106.

Figure 12:
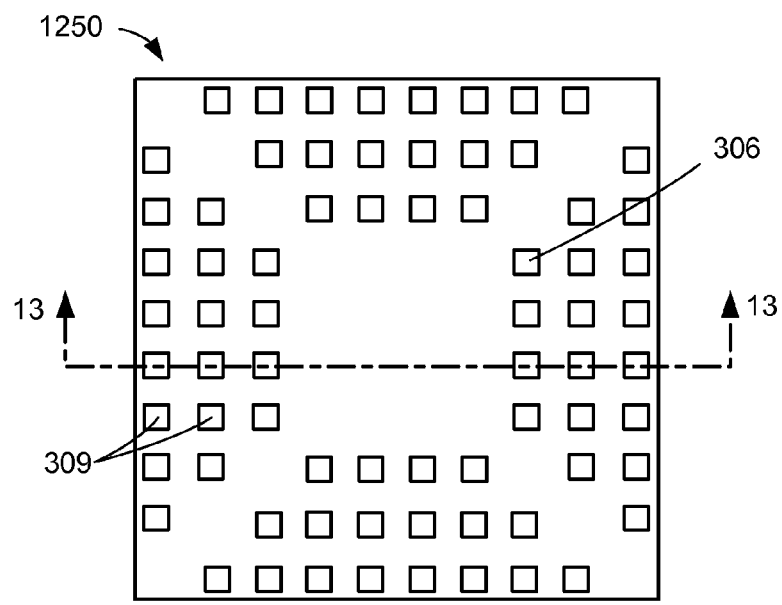
FIG. 12 is a top view of a top view of a portion of a lead frame.

Referring now to FIG. 12, therein is shown a top view of a portion of a lead frame 1250. The top view depicts the lead frame 1250. The plated interconnect pads 306 can be formed over the lead frame 1250. The plated interconnect pads 306 are formed as a separate and distinct structure from the lead frame 1250. The plated interconnect pads 306 can be formed by a number of methods. For example, the plated interconnect pads 306 can be formed by known methods such as chemical or physical vapor deposition.

The interlock pads 309 can be formed over the lead frame 1250. The interlock pads 309 are formed as a separate and distinct structure from the lead frame 1250. The interlock pads 309 can be formed by a number of methods. For example, the interlock pads 309 can be formed by known methods such as chemical or physical vapor deposition. The interlock pads 309 can be formed in the step as forming the plated interconnect pads 306.

For illustrative purposes, the lead frame 1250 is shown with two rows of interlock pads 309, although it is understood that the lead frame 1250 can be formed with a different configuration of the interlock pads 309. For example, each row can have the same number of interlock pads 309. As another example, the interlock pads 309 in one row can be in a staggered configuration from the interlock pads 309 in the other row.

Figure 13:
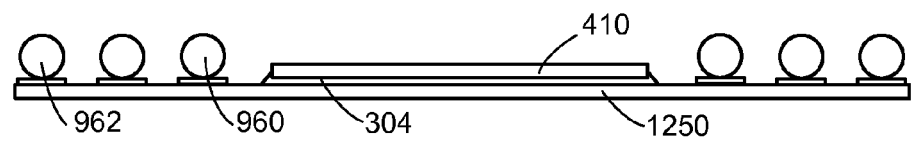
FIG. 13 is a cross-sectional view of the structure along line 13-13 of FIG. 12 in mounting the integrated circuit.

Referring now to FIG. 13, therein is shown a cross-sectional view of the structure along line 13-13 of FIG. 12 in mounting the integrated circuit 410. The integrated circuit 410 can be mounted over lead frame 1250 with the adhesive 304 in between.

First interconnects 1360, such as solder balls, solder bumps, or conductive bumps, can be attached to the plated interconnect pads 306. The first interconnects 1360 can have a spherical or elliptical shape.

Second interconnects 1362, such as solder balls, solder bumps, or conductive bumps, can be attached to the interlock interconnects 424. The second interconnects 1362 can have a spherical or elliptical shape.

The first interconnects 1360 and the second interconnects 1362 can be formed in a number of different ways. For example, the first interconnects 1360 and the second interconnects 1362 can be formed by known methods such as a solder ball mounting over a solder ball mask. As a further example, the first interconnects 1360 and the second interconnects 1362 can be formed by a reflow process after flux pin doting on the lead frame 1250.

Figure 14:
FIG. 14 is the structure of FIG. 13 in a connecting the internal interconnects.

Referring now to FIG. 14, therein is shown the structure of FIG. 13 in connecting the internal interconnects 416. The internal interconnects 416 can connect the integrated circuit 410 and the plated interconnect pads 306. The internal interconnects 416 can connect the integrated circuit active side 412 and the plated interconnect pads 306.

Figure 15:
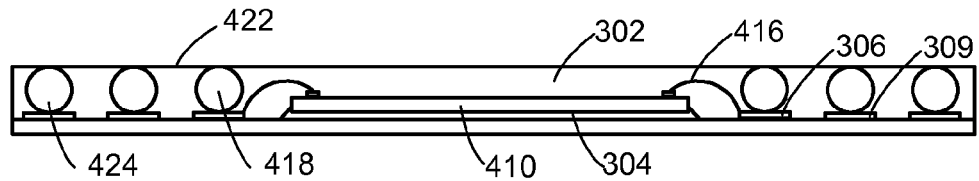
FIG. 15 is the structure of FIG. 14 in forming the encapsulation.

Referring now to FIG. 15, therein is shown the structure of FIG. 14 in forming the encapsulation 302. The encapsulation 302 can partially cover the adhesive 304, the plated interconnect pads 306, and the interlock pads 309. The encapsulation 302 can be formed by a number of different methods. For example, the structure of FIG. 14 can be placed between planar mold chase (not shown) and can undergo transfer or injection molding.

The encapsulation 302 can be formed to have the encapsulation second side 422. The encapsulation 302 can cover the integrated circuit 410, the internal interconnects 416, the first interconnects 1360 of FIG. 13, and the second interconnects 1362 of FIG. 13.

The first interconnects 1360 can be exposed from the encapsulation second side 422 to form the embedded interconnects 418. The embedded interconnects 418 can be formed to be coplanar with the encapsulation second side 422. The spherical or elliptical shape of the embedded interconnects 418 function as a mold lock with the encapsulation 302.

The encapsulation 302 can be formed to expose the second interconnects 1362 to form the interlock interconnects 424 of FIG. 3. The interlock interconnects 424 can be formed to be coplanar with the encapsulation second side 422. The spherical or elliptical shape of the interlock interconnects 424 function as a mold lock with the encapsulation 302.

Figure 16:
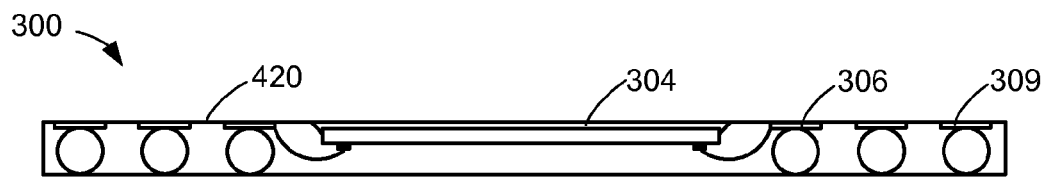
FIG. 16 is the structure of FIG. 15 in forming the integrated circuit packaging system of FIG. 3.

Referring now to FIG. 16, therein is shown the structure of FIG. 15 in forming the integrated circuit packaging system 300 of FIG. 3. The lead frame 1250 of FIG. 12 can be removed to form the integrated circuit packaging system 300. The lead frame 1250 can be removed by a number of different methods. For example, the lead frame can be removed by know methods such as chemical etching with a selective etch pattern. The lead frame 1250 can be removed to form a solid ground plane (not shown) or a reference plane (not shown).

The lead frame 1250 can be removed to form the encapsulation first side 420. The adhesive 304 can be exposed from and coplanar with the encapsulation first side 420. The plated interconnect pads 306 can be exposed from and coplanar with the encapsulation first side 420. The plated interconnect pads 306 can include characteristics of the lead frame 1250 removed. The characteristics of the lead frame 1250 removed can include physical features, such as an etched surface, grinding marks, sanding marks, polishing marks, other removal tool marks, chemical residue, or a chemically processed surface.

The interlock pads 309 can be exposed from and coplanar with the encapsulation first side 420. The interlock pads 309 can include characteristics of the lead frame 1250 removed. The characteristics of the lead frame 1250 removed can include physical features, such as an etched surface, grinding marks, sanding marks, polishing marks, other removal tool marks, chemical residue, or a chemically processed surface.

The lead frame 1250, the first dam bar 1254, the second dam bar 1256, the third dam bar 1258, the first tie bar 1255, the second tie bar 1257, and the third dam bar 1259 can be selectively separated to isolate the plated interconnect pads 306 and the interlock pads 309. For example, the first tie bar 1255 can be removed to isolate the first dam bar 1254 from the paddle 1252 and the second dam bar 1256. As a further example, the portions of the first dam bar 1254 can be removed to maintain connectivity between a number of plated interconnect pads 306.

Figure 17:
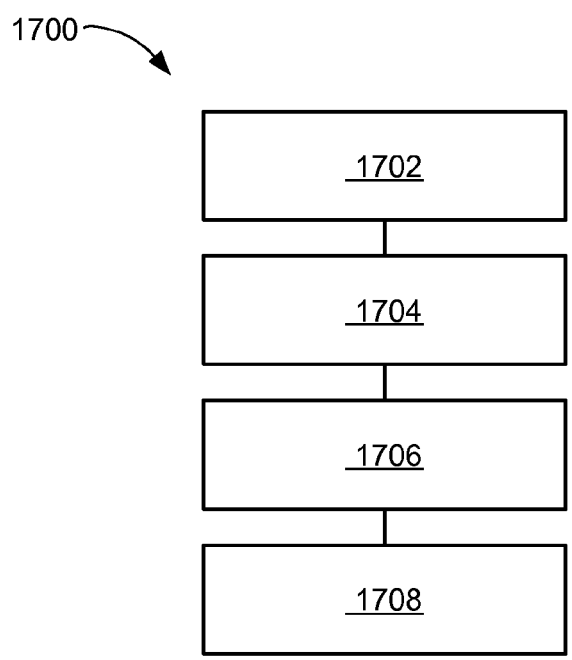
FIG. 17 is a flow chart of a method of manufacture of an integrated circuit packaging system in an embodiment of the present invention.

Referring now to FIG. 17, therein is shown a flow chart of a method 1700 of manufacture of the integrated circuit packaging system 100 in an embodiment of the present invention. The method 1700 includes providing an integrated circuit with an adhesive attached thereto in a block 1702; connecting the integrated circuit and a plated interconnect pad in a block 1704; attaching an embedded interconnect to the plated interconnect pad in a block 1706; and forming an encapsulation, having an encapsulation first side and an encapsulation second side, around the integrated circuit, the embedded interconnect, and the plated interconnect pad with the embedded interconnect exposed from the encapsulation second side and the plated interconnect pad and the adhesive exposed from the encapsulation second side in a block 1708.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   an integrated circuit;
   an adhesive attached to the integrated circuit;
   a plated interconnect pad connected to the integrated circuit;
   an embedded interconnect, having an elliptical shape, attached to the plated interconnect pad;
   an internal interconnect connected between the integrated circuit and the plated interconnect pad, the internal interconnect in direct contact with no intervening element to the plated interconnect pad on the side of the plated interconnect pad attached to the embedded interconnect; and
   an encapsulation, having an encapsulation first side and an encapsulation second side, around the integrated circuit, the embedded interconnect, and the plated interconnect pad with the embedded interconnect exposed from the encapsulation second side, the plated interconnect pad and the adhesive coplanar with the encapsulation first side and exposed from the encapsulation first side, and the elliptical shape of the embedded interconnects forming a mold interlock with the encapsulation.

2. The system as claimed in claim 1 further comprising a through interconnect covered by the encapsulation with the through interconnect exposed from and coplanar with the encapsulation first side as well as exposed from and coplanar with the encapsulation second side.

3. The system as claimed in claim 1 further comprising:
an interlock pad exposed at and coplanar with the encapsulation first side;
an interlock interconnect attached to the interlock pad; and
the interlock interconnect covered by the encapsulation with the interlock interconnect exposed from and coplanar with the encapsulation second side.

4. The system as claimed in claim 1 wherein the adhesive includes a thermal adhesive.

5. The system as claimed in claim 1 wherein the encapsulation around the embedded interconnect and the plated interconnect pad includes the mold interlock in the encapsulation.

6. The system as claimed in claim 1 further comprising an internal interconnect connecting the integrated circuit and a plated interconnect.

7. The system as claimed in claim 6 wherein:
the encapsulation first side is coplanar with the adhesive and the plated interconnect pad; and
the encapsulation second side is coplanar with the embedded interconnect.

8. The system as claimed in claim 6 further comprising:
a mountable structure with the encapsulation second side mounted over the mountable structure; and
a stackable integrated circuit-package mounted over the encapsulation first side.

9. The system as claimed in claim 6 wherein the internal interconnect includes a wire.

10. The system as claimed in claim 6 wherein the plated interconnect pad has the characteristics of a lead frame removed including an etched surface.

11. A method of manufacture of an integrated circuit packaging system comprising:
providing an integrated circuit with an adhesive attached thereto;
connecting the integrated circuit and a plated interconnect pad;
attaching an embedded interconnect, having an elliptical shape, to the plated interconnect pad;
connecting an internal interconnect between the integrated circuit and the plated interconnect pad, the internal interconnect in direct contact with no intervening element to the plated interconnect pad on the side of the plated interconnect pad attached to the embedded interconnect; and
forming an encapsulation, having an encapsulation first side and an encapsulation second side, around the integrated circuit, the embedded interconnect, and the plated interconnect pad with the embedded interconnect exposed from the encapsulation second side, the plated interconnect pad and the adhesive coplanar with the encapsulation first side and exposed from the encapsulation first side, and the elliptical shape of the embedded interconnect forming a mold interlock with the encapsulation.

12. The method as claimed in claim 11 further comprising:
forming the plated interconnect pad over a lead frame; and removing selectively a portion of the lead frame.

13. The method as claimed in claim 11 wherein forming the encapsulation around the embedded interconnect and the plated interconnect pad includes forming the mold interlock in the encapsulation.

14. The method as claimed in claim 11 wherein providing the integrated circuit with the adhesive includes providing the integrated circuit with a thermal adhesive.

15. The method as claimed in claim 11 further comprising:
forming an interlock pad exposed at and coplanar with the encapsulation first side;
attaching an interlock interconnect to the interlock pad; and
wherein:
forming the encapsulation includes covering the interlock interconnect with the interlock interconnect exposed from and coplanar with the encapsulation second side.

16. A method of manufacture of an integrated circuit packaging system comprising:
providing an integrated circuit with an adhesive attached thereto;
connecting an internal interconnect between the integrated circuit and a plated interconnect pad with the plated interconnect pad adjacent to the integrated circuit;
attaching an embedded interconnect, having an elliptical shape, to the plated interconnect pad;
connecting an internal interconnect between the integrated circuit and the plated interconnect pad, the internal interconnect in direct contact with no intervening element to the plated interconnect pad on the side of the plated interconnect pad attached to the embedded interconnect; and
forming an encapsulation, having an encapsulation first side and an encapsulation second side, around the integrated circuit, the embedded interconnect, and the plated interconnect pad with the embedded interconnect exposed from the encapsulation second side, the plated interconnect pad and the adhesive coplanar with the encapsulation first side and exposed from the encapsulation first side, and the elliptical shape of the embedded interconnects forming a mold interlock with the encapsulation.

17. The method as claimed in claim 16 wherein forming the encapsulation includes:
forming the encapsulation first side coplanar with the adhesive and the plated interconnect pad; and
forming the encapsulation second side coplanar with the embedded interconnect.

18. The method as claimed in claim 16 further comprising:
forming a through interconnect; and
wherein:
forming the encapsulation includes covering the through interconnect with the through interconnect exposed from and coplanar with the encapsulation first side and exposed from and coplanar with the encapsulation second side.

19. The method as claimed in claim 16 further comprising:
mounting the encapsulation second side over a mountable structure with the embedded interconnect connected to the mountable structure; and
mounting a stackable integrated circuit package over the encapsulation first side with the plated interconnect pad connected to the stackable integrated circuit package.

20. The method as claimed in claim 16 wherein connecting the internal interconnect includes connecting a wire.

* * * * *

UNITED STATES PATENT AND TRADEMARK OFFICE
CERTIFICATE OF CORRECTION

PATENT NO. : 8,476,775 B2  Page 1 of 1
APPLICATION NO. : 12/639997
DATED : July 2, 2013
INVENTOR(S) : Yang et al.

It is certified that error appears in the above-identified patent and that said Letters Patent is hereby corrected as shown below:

In the Specification:

Column 4, line 16, delete "intergrated circuit" and insert therefor --integrated circuit--

Signed and Sealed this
Third Day of November, 2015

Michelle K. Lee
*Director of the United States Patent and Trademark Office*